(12) United States Patent
Kurachi et al.

(10) Patent No.: US 10,283,585 B2
(45) Date of Patent: May 7, 2019

(54) PROCESS OF FORMING CAPACITOR

(71) Applicant: SUMITOMO ELECTRIC DEVICE INNOVATIONS, INC., Yokohama, Kanagawa (JP)

(72) Inventors: Yasuyo Kurachi, Kanagawa (JP); Takeshi Igarashi, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 11 days.

(21) Appl. No.: 15/641,681

(22) Filed: Jul. 5, 2017

(65) Prior Publication Data
US 2018/0012954 A1 Jan. 11, 2018

(30) Foreign Application Priority Data
Jul. 5, 2016 (JP) .................. 2016-133404

(51) Int. Cl.
*H01L 49/02* (2006.01)
*H01L 21/768* (2006.01)

(52) U.S. Cl.
CPC .......... *H01L 28/60* (2013.01); *H01L 21/7687* (2013.01); *H01L 21/76816* (2013.01); *H01L 21/76834* (2013.01)

(58) Field of Classification Search
USPC ......................................................... 438/396
See application file for complete search history.

(56) References Cited

U.S. PATENT DOCUMENTS

| 5,812,364 | A | * | 9/1998 | Oku | ........................ | H01L 29/94 257/306 |
| 6,297,527 | B1 | * | 10/2001 | Agarwal | ................ | H01G 4/008 257/296 |
| 2013/0134555 | A1 | | 5/2013 | Kurachi | | |
| 2015/0021597 | A1 | * | 1/2015 | Lu | ..................... | H01L 29/66742 257/43 |
| 2015/0200243 | A1 | | 7/2015 | Nonaka | | |
| 2016/0028371 | A1 | * | 1/2016 | Nishihara | ................ | H03H 3/04 333/133 |

FOREIGN PATENT DOCUMENTS

JP 2010-080780 4/2010

* cited by examiner

*Primary Examiner* — Marcos D. Pizarro
*Assistant Examiner* — Lawrence C Tynes, Jr.
(74) *Attorney, Agent, or Firm* — Smith, Gambrell & Russell, LLP.

(57) ABSTRACT

A process of forming a metal-insulator-metal (MIM) capacitor is disclosed. The process includes steps of (i) forming an insulating film as a dielectric film of the MIM capacitor; (ii) forming a first portion of an upper electrode by a metal evaporation and a lift-off technique subsequent to the metal evaporation; and (iii) forming a second portion of the upper electrode by the metal evaporation and the lift-off technique subsequent to the metal evaporation for the second portion.

9 Claims, 8 Drawing Sheets

PROCESS OF FORMING CAPACITOR

CROSS REFERENCE TO RELATED APPLICATION

The present application claims the benefit of priority of Japanese Patent Application No. 2016-133404, filed on Jul. 5, 2016, which is incorporated herein by reference.

BACKGROUND OF INVENTION

1. Field of Invention

The present invention relates to a process of forming a capacitor, in particular, a capacitor integrated with a semiconductor device.

2. Background Arts

Recent semiconductor devices, in particular, those primarily made of gallium arsenide (GaAs), gallium nitride (GaN) and so on integrate capacitors, interconnections, inductors, and electrodes used in impedance matching circuits. A Japanese Patent application laid open No. 2010-080780A has disclosed a semiconductor device that integrates a capacitor with a field effect transistor (FET). The capacitor disclosed therein, which is a type of, what is called a metal-insulator-metal (MIM) capacitor provided on an insulating layer that covers the FET, includes a lower electrode, an upper electrode, and a die-electric film sandwiched between the electrodes. The process of forming the capacitor disclosed therein removes residuals left on the upper electrode by dry-etching.

SUMMARY OF THE INVENTION

One aspect of the present invention relates to a process of forming a metal-insulator-metal (MIM) capacitor. The process includes steps of (i) forming an insulating film as a dielectric film of the MIM capacitor; (ii) forming a first portion of an upper electrode by a metal evaporation and a lift-off technique subsequent to the metal evaporation; and (iii) forming a second portion of the upper electrode by the metal evaporation and the lift-off technique subsequent to the metal evaporation for the second portion. According to the process, even pinholes are induced in the first portion of the upper electrode during the formation thereof and the processes subsequent thereto; the pinholes may be effective filled with the second portion of the upper electrode.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, preferred embodiment of the present invention will be described as referring to drawings. In the description of the drawings, numerals or symbols same with or similar to each other will refer to elements same with or similar to each other without duplicating explanations. Also, a capacitor described below is unnecessary to be integrated with a semiconductor active device, such as a field effect transistor (FET).

Figure 1:
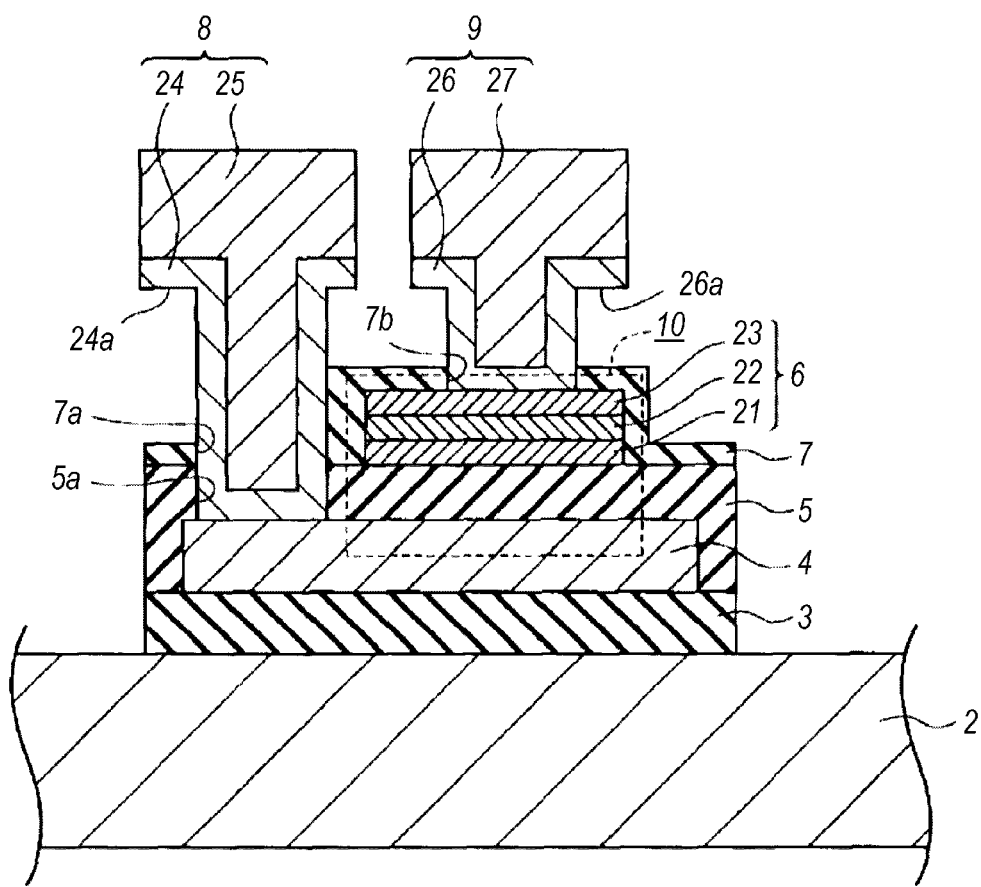
FIG. 1 shows a cross section of a capacitor according to embodiment of the present invention.

FIG. 1 shows a cross section of a capacitor according to embodiment of the present invention. The capacitor 10 shown in FIG. 1 which is formed on a semiconductor substrate 2, exactly the capacitor 10 is provided on the semiconductor substrate 2 through an insulating layer 3. The capacitor 10 includes a lower electrode 4 provided on the insulating layer 3, an insulating film 5 provided on the lower electrode 4, and an upper electrode 6 provided on the insulating film 5, where they are covered with another insulating layer 7. The lower electrode 4 is connected to an interconnection 8, while, the upper electrode 6 is connected to another interconnection 9. Those electrodes, 4 and 6, and the insulating film 5 constitute the capacitor of a type of metal-insulator-metal (MIM) capacitor.

The semiconductor substrate 2, which is prepared for growing semiconductor layers thereon, has a circular or a rectangular plane shape. The semiconductor substrate 2, which may be made of gallium nitride (GaN), gallium arsenide (GaAs), sapphire ($Al_2O_3$), and/or silicon (Si), provides semiconductor active devices such as field effect transistors (FETs), high electron-mobility transistor (HEMT), and so on in addition to the capacitor 10.

The insulating layer 3, which electrically isolates the capacitor 10 from the semiconductor substrate 2, may be made of silicon oxide (SiO2), silicon nitride (SiN), silicon oxy-nitride (SiON), and so on. The insulating layer 3 is preferably made of SiN from a viewpoint to suppress the oxidization of the lower electrode 4. The insulating layer 3 may be formed by, for instance, chemical vapor deposition (CVD) technique.

The lower electrode 4 may include one or more metals, typically gold (Au). The lower electrode 4, which may be formed by a metal-evaporation, a sputtering, and/or a plating, has a thickness of about 100 nm. The insulating film 5, which constitutes a dielectric layer of a MIM capacitor, covers the lower electrode 4. The insulating film 5 provides an opening 5a through which the lower electrode 4 exposes. The opening 5a in the insulating film 5 is not overlapped with the upper electrode 6 and filled with the interconnection 8. The insulating film 5, which may be made of SiN with a thickness of about 250 nm formed by a plasma-enhanced CVD (p-CVD) technique.

The upper electrode 6 includes one or more metal layers. The upper electrode 6 overlaps the lower electrode 4 as interposing the insulating film 5 therebetween but has an area narrower than an area of the lower electrode 4. That is, the upper electrode 6 in a perspective view thereof is inside of the lower electrode 4, or the lower electrode 4 in a portion thereof extends from an outer periphery of the upper electrode 6 in the perspective view thereof. The upper electrode 6 provides stacked metals of the first to third layers, 21 to 23, from the lower to the upper with a total thickness of 200 to 400 nm. The first to third metal layers, 21 to 23, preferably have thicknesses of about 100 nm, about 50 nm, and about 100 nm, respectively. The first to third metal layers, 21 to 23, may be formed by the metal-evaporation.

In the present embodiment, the second metal layer 22 has a melting temperature higher than melting temperatures of the first and third metal layers, 21 and 23. For instance, the first and third metal layers, 21 and 23, may be made of gold (Au) whose melting temperature is 1064° C.; while, the second metal layer 22 may be made of titanium (Ti) with a melting temperature of 1668° C., platinum (Pt) with a melting temperature of 1768° C., and so on. The first and the third metal layers, 21 and 23, may be made of metal common to each other, or may be made of metals different from each other.

The cover layer 7 is, what is called, a passivation layer capable of preventing or suppressing of invasion of water or moisture into the capacitor 10. The cover layer 7 provides openings, 7a and 7b, where the former opening 7a overlaps with the opening 5a provided in the insulating film 5, while, the latter opening 7b overlaps with the upper electrode 6. That is, the opening 7b exposes the top surface of the upper electrode 6. Filled within the opening 7a is an interconnection 8, while, filled within the opening 7b is another interconnection 9. The cover layer 7 may be made of silicon nitride (SiN) with a thickness of about 100 nm formed by the CVD technique.

The interconnection 8 is electrically and physically in contact with the lower electrode 4. Specifically, the interconnection 8 is in contact with the top of the lower electrode 4 through the opening 7a in the cover layer 7 and the opening 5a in the insulating film 5. The interconnection 8 includes two metal layers, 24 and 25, stacked to each other from the side of the lower electrode 4. FIG. 1 shows the metal layer 24 in a portion of a bottom surface 24a thereof is apart from the lower electrode 4, the insulating film 5, and the cover layer 7. However, in an alternative, the metal layer 24 in the bottom surface 24a thereof may be in contact with those of the lower electrode 4, the insulating film 5 and the cover layer 7. The metal layer 24 may be made of a stacked metal of titanium-tungsten (TiW) and gold (Au), namely TiW/Au, which may operate as a seed layer. While, the metal layer 25 may be made of gold (Au). The metal layer 24 may be formed by the metal-evaporation and/or sputtering, while, the metal layer 25 may be formed by plating.

The other interconnection 9 is electrically and physically in contact with the top of the upper electrode 6 through the opening 7b in the cover layer 7. The interconnection 9 also has a stacked arrangement of two metal layers, 26 and 27. The metal layer 26 provided in a lower side of the stack is in bottom surface 26a thereof apart from the upper electrode 6 and the cover layer 7; but, the metal layer 26 in the bottom surface 26a thereof may be wholly in contact with the upper electrode 6 and the cover layer 7. The lower metal layer 26 may be made of, similar to the former metal layer 24, a stacked structure of titanium-tungsten (TiW) and gold (Au), namely, TiW/Au, while, the upper metal layer 27 may be made of gold (Au). The lower metal layer 24, which may be formed by sputtering, operates as a seed metal for metal plating, while, the upper metal layer 27 is formed by plating.

Next, a process of forming the capacitor 10 shown in FIG. 1 will be described as referring to FIGS. 2 to 5.

Figure 2A:
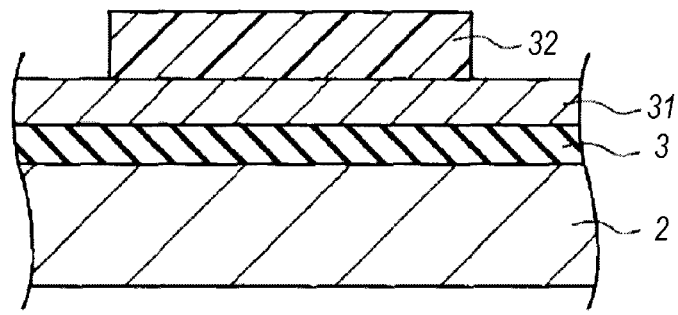
FIGS. 2A to 2C show cross sections of the capacitor at respective steps of the process thereof.

As FIG. 2A shows as the first step, a mask 32 is patterned by a photolithography on a metal 31, which is provided on the insulating layer 4. The insulating layer 3 is formed on the semiconductor substrate 2 by the CVD technique, and the metal 31 is formed on the insulating layer 3 by the metal evaporation and/or the sputtering in advance to the present step of the process. The mask 32 may be cured or hardened by irradiating ultraviolet rays or the heat treatment thereof.

Figure 2B:
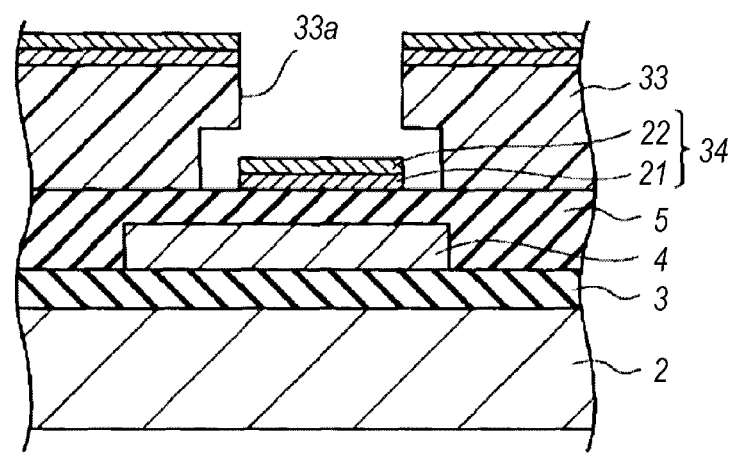

As FIG. 2B shows as the second step, the metal 31 is selectively etched in a portion not covered with the patterned mask 32 to form the lower electrode 4. A wet etching may carry out the selective etch of the metal 31. Then, the process deposits the insulating film 5 so as to fully cover, or bury, the lower electrode 4, as the third step. Then, the process further deposits a patterned mask 33 that provides an opening 33a with an overhung as the fourth step. The opening 33a overlaps with the lower electrode 4, exactly, outer peripheries of the opening 33a are wholly inside of outer peripheries of the lower electrode 4. The patterned mask 33 may be made of photoresist patterned by photolithography and/or electron beam exposure. Then, the metal evaporation deposits the metal 34 on the insulating film 5 as the first portion of the upper electrode 6. The sputtering for depositing the metal 34 is unfavorable because plasma inevitably accompanied with the sputtering possibly causes damage on the insulating film 5. Also, the plating is unfavorable for depositing the metal 34 because the plating also utilizes the sputtering for preparing the seed metal. The fifth step of the process carries out the evaporation of the first and second metal layers, 21 and 22, sequentially on the insulating film 5, where the first and the second metal layers, 21 and 22, constitute the first portion of the upper electrode 6. The present embodiment distinguishes the second metal layer 22 from the first metal layer 21, that is, the second metal layer 22 is different from the first metal layer 21. The first metal layer 21 and the second metal layer 22 are adjusted in thicknesses thereof such that the total thickness of the first to third metal layers, 21 to 23, becomes 200 to 400 nm.

Figure 2C:
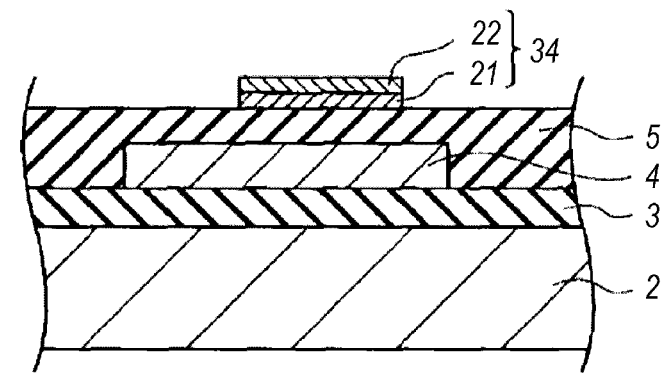

Then, as shown in FIG. 2C as the sixth step, residual metals left on the patterned mask 33 are removed by the lift-off technique. Then, the first portion 34 of the upper electrode 6 is left on the insulating film 5.

Figure 3A:
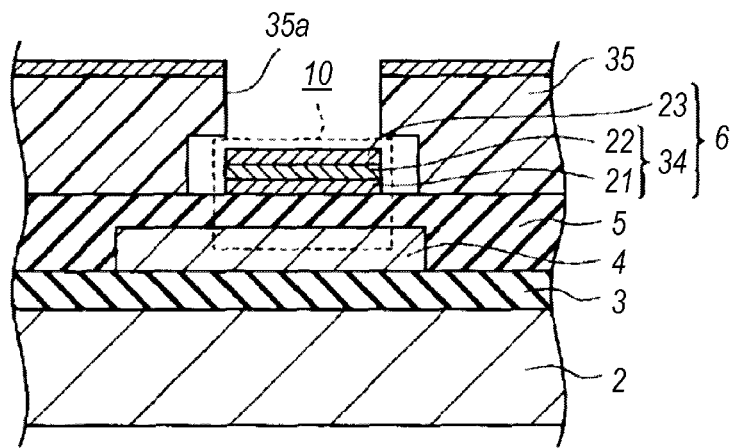
FIGS. 3A to 3C show cross sections of the capacitor at respective steps of the process thereof.

Then, as FIG. 3A shows as the seventh step, the process further forms another patterned mask 35 on the insulating film 5. The patterned mask 35 provides an opening 35a with a plane shape overlapping with the first portion 34 patterned by a conventional photolithography, and/or the electron beam exposure. The opening 35a may fully trace the former opening 33a, or have dimensions narrower than those of the former opening 33a. After the deposition of the patterned mask 35, the third metal 23 is deposited on the second metal layer 22 as the second portion of the upper electrode 6, and removed in residual portions thereof left on the patterned mask 35 in the lift-off technique subsequently carried out, as the eighth step. Thus, the upper electrode 6, which stacks the first to third metals, is formed on the insulating film 5.

Figure 3B:
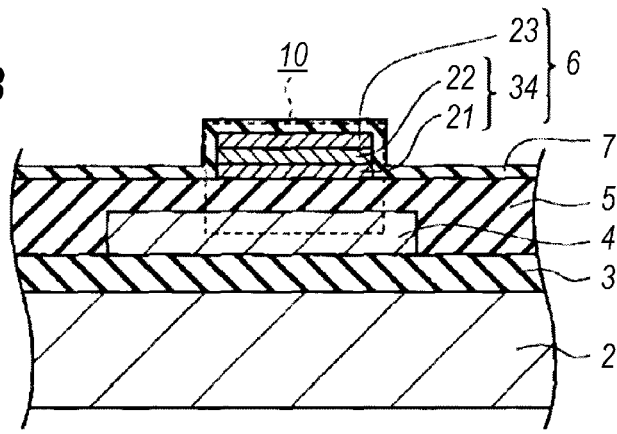

Then, as FIG. 3B shows as the ninth step, the cover layer 7 is deposited on the upper electrode 6 and the insulating film 5 exposed from the upper electrode 6. The cover layer 7 fully covers, or buries the upper electrode therein.

Figure 3C:
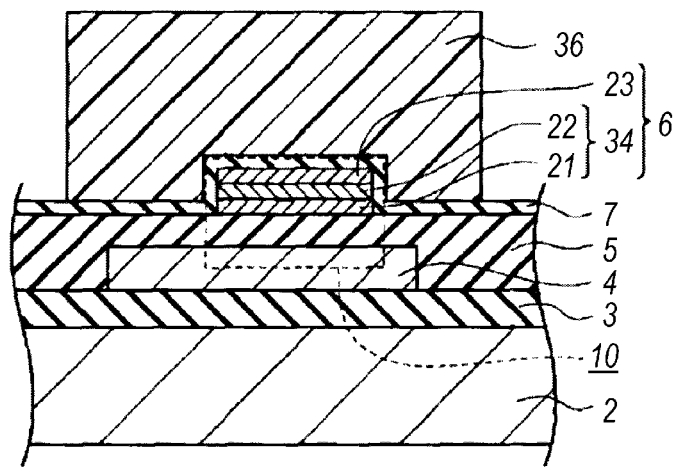
Figure 4A:
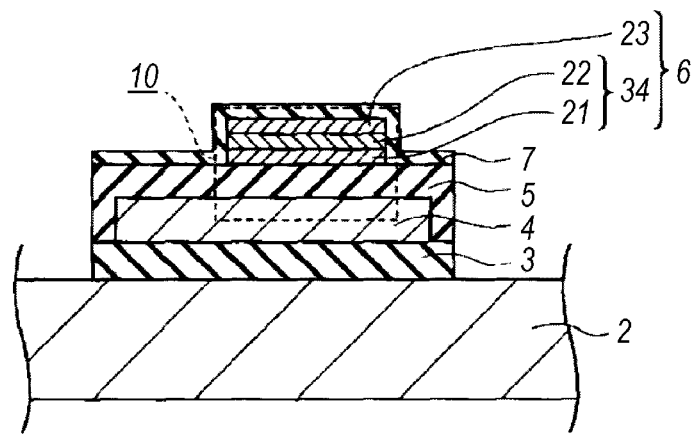
FIGS. 4A to 4C show cross sections of the capacitor at respective steps of the process thereof.

Then, as FIG. 3C shows as the tenth step, still another mask 36 is patterned on the cover layer 7 by the photolithography. The patterned mask 36 fully covers, or buries the upper electrode 6 and has a plane size fully covering the lower electrode 4. Then, as shown in FIG. 4A as the eleventh step, the cover layer 7, the insulating film 5, and the insulating layer 3 in portions exposed from the patterned mask 36 are removed so as to expose the surface of the semiconductor substrate 2. The selective removal of those layers and films, 3 to 7, may be carried out by dry-etching using reactive gasses containing fluorine.

Figure 4B:
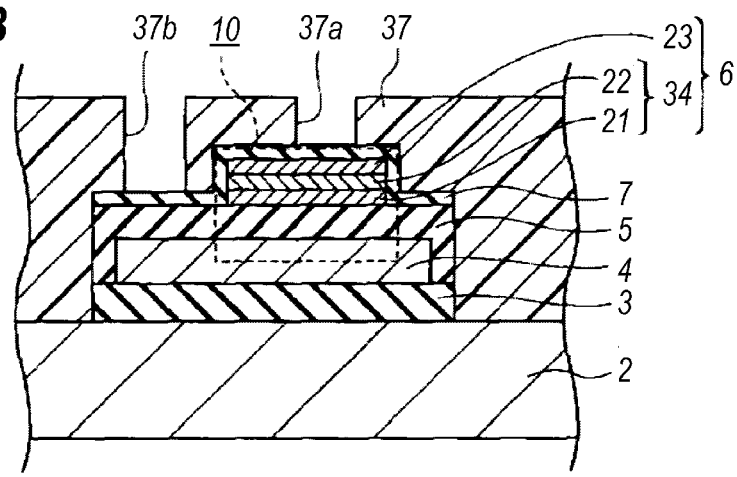

Then, as FIG. 4B shows as the twelfth step, another patterned mask 37 is deposited on the semiconductor substrate 2. The patterned mask 37 fully buries the MIM capacitor covered with the cover layer 7. The patterned mask 37 provides openings, 37a and 37b, where the former opening 37a overlaps with the upper electrode 6, while, the latter opening 37b overlaps with an area not overlapping with the upper electrode 6 but overlapping with the lower electrode 4.

Figure 4C:
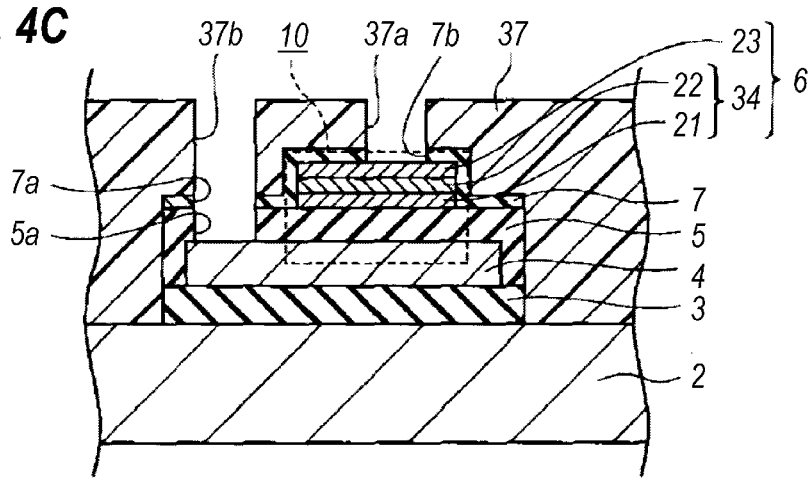

Then, as FIG. 4C illustrates as the thirteenth step, the cover layer 7 is partially etched in areas the openings, 37a and 37b, exposes and the insulating film 5 in a portion overlapping with the latter opening 37b. The partial etching forms the openings, 7a and 7b, in the cover layer 7, and the opening 5a in the insulating film 5. The opening 37a exposes the upper electrode 6, while, the other opening 37b exposes the lower electrode 4.

Figure 5A:
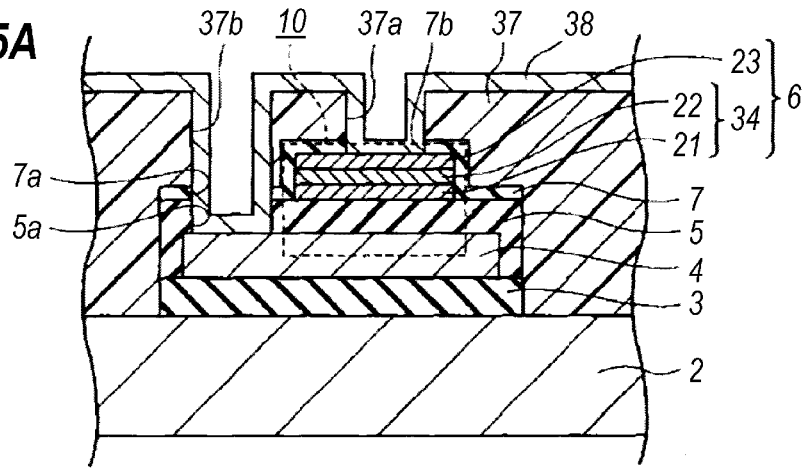
FIGS. 5A to 5C show cross sections of the capacitor at respective steps of the process thereof.

Then, as FIG. 5A illustrates as the fourteenth step, the process deposits a metal layer 38 by the sputtering on the patterned mask 37, on the upper and the lower electrodes, 6 and 4, exposed within the openings, 37a and 37b, and the whole sides of the openings in the cover layer 7 and the insulating film 5 formed from the openings, 37a and 37b. The metal layer 38 may operate as a seed layer for the process of the plating subsequently carried out.

Figure 5B:
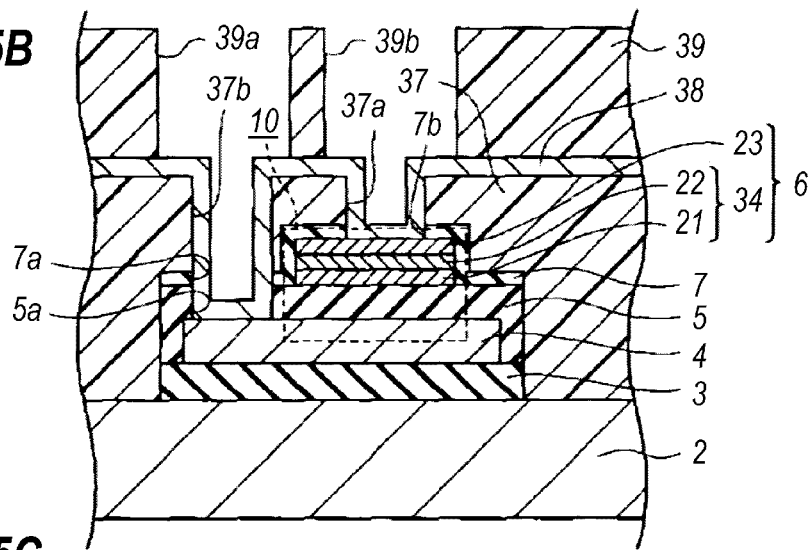

Then, as FIG. 5B shows as the fifteenth step, still another patterned mask 39 is formed on the metal layer 38, where the patterned mask 39 provides openings, 39a and 39b. The former opening 39a fully exposes the metal layer 38 in the openings, 5a and 7a, that is, the opening 39a has a size enough larger than a size of the openings, 5a and 7a; while, the latter opening 39b exposes the metal layer 38 in the opening 7b, that is, the opening 39b has a size enough greater than a size of the opening 7b. The patterning of the mask 39 may be carried out by the conventional photolithography, and/or the conventional electron beam exposure.

Figure 5C:
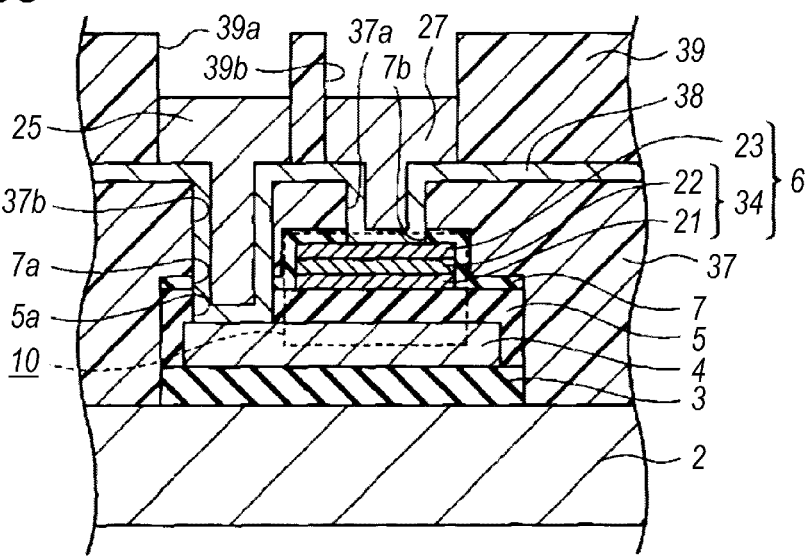

Then, as FIG. 5C shows as the sixteenth step, the plating may forms the metal layer 25 within the opening 39a and another metal layer 27 on the metal layer 38 exposed within the opening 39b. The plating may be an electro-plating using the metal layer 38 as the seed layer or an electroless-plating. Thereafter, the process first removes the upper patterned mask 39 by solvent; then, selectively the metal layer 38 exposed by the removal of the patterned mask 39. Then, the lower patterned mask 37 exposed by the removal of the metal layer 38 is also removed. Then, the stacked structure of the interconnection 8, which includes the metal layer 25 accompanied with the metal layer 38, is left within the openings, 7a and 5a, where the metal layer 38 is converted into the lower metal layer 24. Also the stacked structure of the interconnection 9, which includes the metal layer 27 accompanied with the metal layer 38, is left with the opening 7b, where the metal layer 38 is converted into the lower metal layer 26. Thus, the capacitor 10 accompanied with the interconnections, 8 and 9, that lead the lower and the upper electrodes, 4 and 6, out of the capacitor 10 may be completed.

Figure 6A:
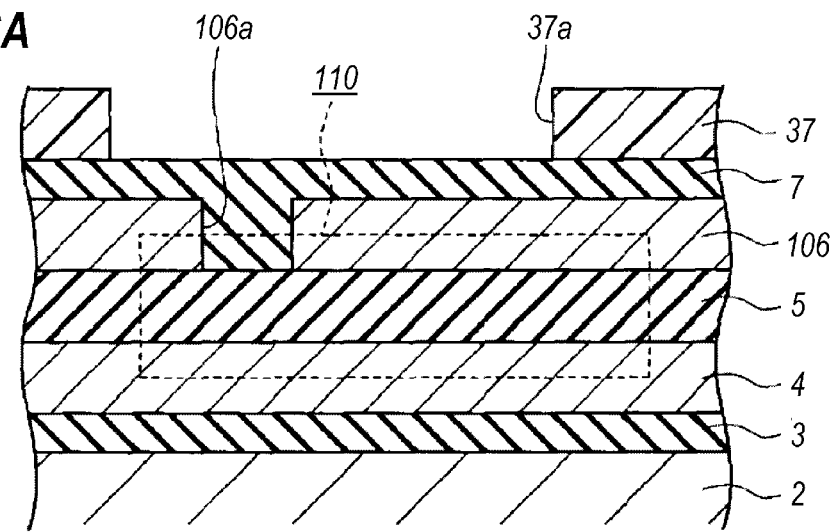
FIGS. 6A and 6B show cross sections of a capacitor at steps of a process thereof comparable to the present invention.
Figure 6B:
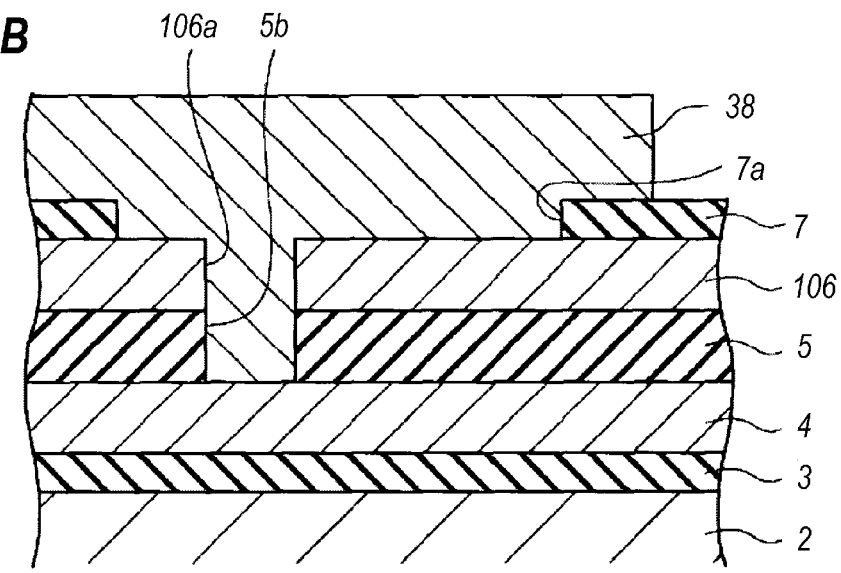
Figure 7A:
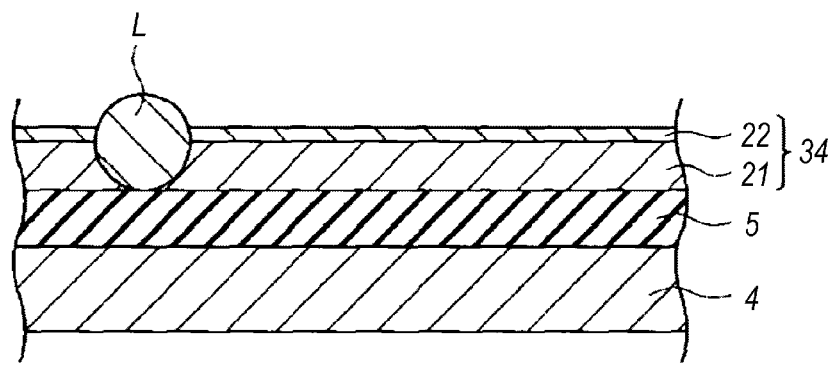
FIGS. 7A to 7C show cross section of the capacitor of the present invention at respective steps of the process thereof.
Figure 7B:
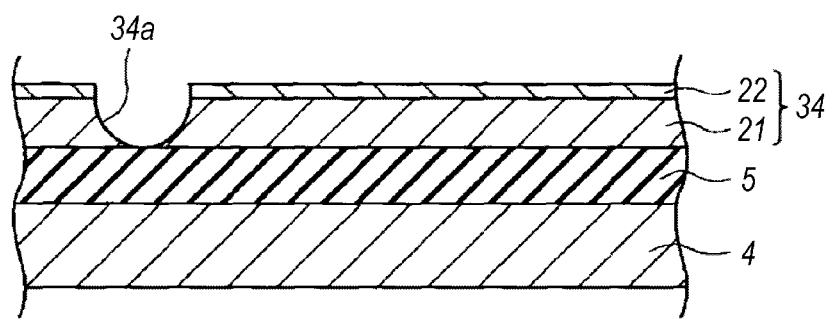
Figure 7C:
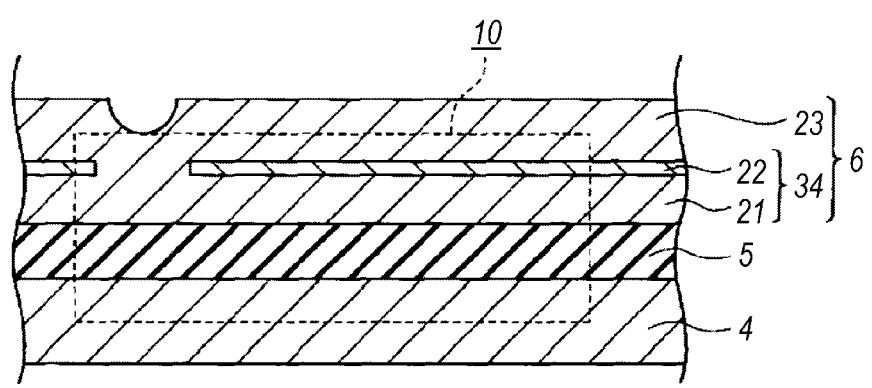
Figure 8:
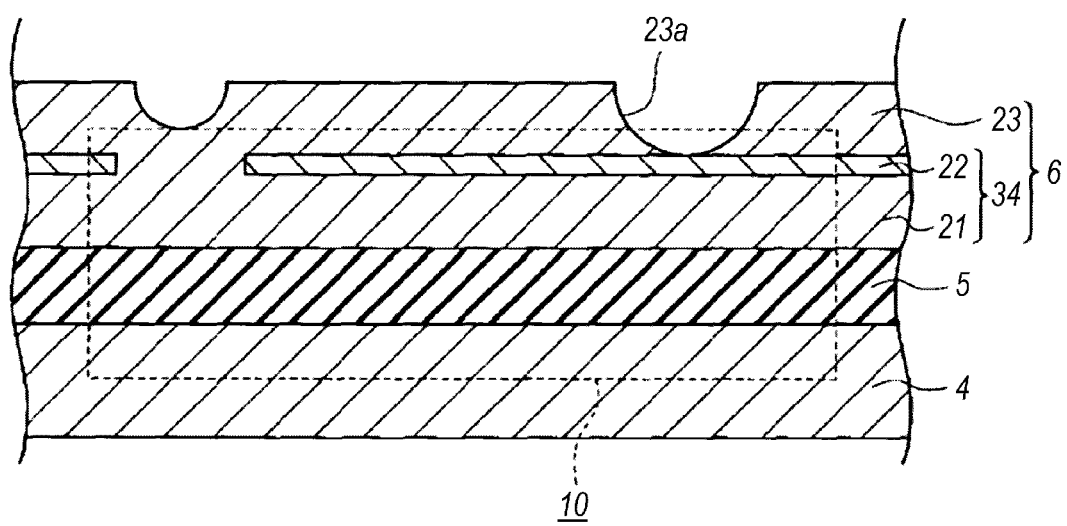
FIG. 8 shows a cross section of a capacitor according to another embodiment of the present invention.

Next, advantages of the capacitor 10 will be described as referring to FIGS. 6 to 8, where FIGS. 6A and 6B show cross sections of a capacitor 110 comparable to the capacitor 10 of the present invention, FIGS. 7A to 7C extract processes that explain advantages of the present invention, and FIG. 8 shows a cross section of a capacitor modified from the embodiment shown in FIG. 1.

The capacitor 110 comparable to the present invention includes the lower electrode 4, the insulating film 5, and the upper electrode 106 provided on the insulating film 5. However, the upper electrode 106 is formed by a mono metal layer possibly including pinholes 106a with a diameter of a few micron meters formed during the metal evaporation. For instance, when the upper electrode 106 is formed by the metal evaporation, which inevitably accompanies metal clusters or splashes due to bumping or splashing of a melted source, the clusters and/or the splashes are left on the insulating film 5 and sometimes slipped off therefrom to leave the pinholes 106a in the upper electrode 106.

Depositing the cover layer 7 so as to bury the upper electrode 106, the cover layer 7 fills the pinholes 106a. Moreover, forming the opening 8a on the upper electrode 106, the cover layer 7 filling the pinholes 106a is also etched so as to expose the insulating film 5, and sometimes etches the insulating film 5 so as to leave a pinhole 5b in the insulating film 5. Finally, as FIG. 6B shows, forming the metal layer 38 on the upper electrode 6, the metal layer 38 is electrically in contact with the lower electrode 4 through the pinhole 5b, which resultantly makes a short-circuit from the metal layer 38 to the lower electrode 4, and the capacitor 110 never operates as a capacitor.

On the other hand, the capacitor 10 of the present invention, referring to FIG. 2B, the upper electrode 6 includes the first portion and the second portion, where the first portion 34 is formed by the first patterned mask 33, which possibly causes the clusters or the splashes L in the second metal layer 22 as shown in FIG. 7A and leaves pinholes 34a in the first portion 34 during the lift-off of the first and second metal layers, 21 and 22, left on the patterned mask 33. However, in the present invention as shown in FIG. 3A, the process deposits the third metal 23 on the second metal layer 22 by the second patterned mask 35, which is independent of the first patterned mask 33, and the third metal layer 23 thus deposited may effectively fill the pinhole 34a. When the third meal 23 is continuously and sequentially deposited on the second metal layer 22 by using the first patterned mask 33, the third metal layer 23 is hard to securely cover the clusters and splashes L, or hard to prevent the clusters and splashes L on the first to third metal layers, 21 and 23. Accordingly, the lift-off process performed subsequent to the metal evaporation possibly leaves the pinhole in the first to third metal layers, 21 and 23. A feature and an important factor of the present invention is that the third metal 23 is deposited after the lift-off of the first and the second metal layers, 21 and 22.

Also, during the deposition of the third metal layer 23 using the second patterned mask 35, the clusters and the splashes 23a are inevitably formed on the third metal layer 23. However, it is extremely hard or limited that the clusters and the splashes in the third metal layer 23 is caused in a portion or a point where the clusters and the splashes are caused by the first and second metal layers, 21 and 22. Accordingly, the pinholes 34a caused in the first and second metal layers, 21 and 22, may be effectively compensated, or filled, by the third metal layer 23. Also, the clusters and the splashes 23a in the third metal layer 23 are possibly formed on the first and the second metal layers, 21 and 22, which cause no pinholes in the upper electrode 6.

The fifth step deposits the first portion 34 of the upper electrode 6 on the insulating film 5 using the first patterned mask 33 that provides the opening 33a, and the sixth step carried out subsequent to the fifth step removes the first patterned mask 33 so as to leave the first portion 34 of the upper electrode 6.

The process of the invention further includes the thirteenth step of etching the cover layer 7. That is, the cover layer 7 is deposited at the ninth step after the formation of the upper electrode 6 so as to bury the upper electrode 6 constituted by the three metal layers, 21 to 23. This cover layer 7 in the portion of the upper electrode 6 is etched so as to form the opening 7a at the thirteenth step using the mask 37 that is patterned at the twelfth step. The upper electrode 6 in the third metal layer 23 thereof is physically and electrically connected to the interconnection 9 through the opening 7a in the cover layer 7. The upper electrode 6, in particular, the dual structure of the first and second metal layers, 21 and 22, and the third metal layer 23 formed independent of the former two metal layers, 21 and 22, may effectively prevent the upper electrode 6 from forming the pinholes during the formation of the opening 7a in the cover layer 7. Although the metal layers, 21 and 22, in the first portion 34 thereof causes the pinholes, the pinholes may be filled with third metal layer 23. Accordingly, the upper electrode 6, or the interconnection 9 formed thereon, does not make short-circuits to the lower electrode 4. The upper electrode 6 may have the total thickness, namely, a sum of thicknesses of the first to third metal layers, 21 to 23, of 200 to 400 nm. The first and second metal layers, 21 and 22, may be sequentially deposited by the metal evaporation, and the third metal layer 23 may be also deposited by the metal evaporation because, these metal layers, 21 to 23, in residual portions thereof on the first and second patterned masks, 33 and 35, are finally removed by the lift-off technique. A metal layer formed by the sputtering is generally hard to be removed by the lift-off technique.

The process of forming a MIM capacitor according to the present invention is not restricted to the embodiment described above. For instance, the lower electrode 4, which has the arrangement of the mono metal layer in the embodiment thus described, may have another arrangement of, for instance, two or more metals stacked from each other. In one particular arrangement, the lower metal 4 may be made of a stacked structure of titanium (Ti) and gold (Au).

Also, the first portion 34 in the upper electrode 6 is unnecessary to always include two metal layers, 21 and 22. The first portion 34 may include only the first metal layer 21, and the second portion, which is the third metal layer 23 in the embodiment, may include the second and the third metal layers, 22 and 23. Even in such a case, the pinholes 34a induced in the first metal layer 21 may be filled with at least one of the second metal layer 22 and the third metal layer 23.

Also, the upper electrode 6 may include four or more metal layers. For instance, the upper electrode 6 may include stacked metals of, from the side of the substrate 2, a titanium (Ti) layer, a gold (Au) layer, a Ti layer, an Au layer, and a Ti layer, where at least the first Ti layer constitutes the first portion and the rest layers constitute the second portion. The topmost layer is preferably Ti layer because the top Ti layer may enhance the adhesion against the cover layer 7.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A process of forming a metal-insulator-metal (MIM) capacitor, comprising steps of:

forming an insulating film as a dielectric film of the MIM capacitor;

forming a first portion of an upper electrode on the insulating film by metal evaporation by using a first mask having an opening and a lift-off technique subsequent to the metal evaporation; and forming a second portion of the upper electrode on the first portion by metal evaporation by using a second mask having an opening and a lift-off technique subsequent to the metal evaporation for the second portion, wherein the openings of the first mask and the second mask have different dimensions, and wherein dimension of the opening of the second mask is narrower than the dimension of the opening of the first mask.

2. The process of claim 1, further comprising steps of, after the step of forming the second portion:

covering the second portion of the upper electrode with another insulating film, exposing a top of the second portion of the upper electrode by forming an opening in the another insulating film, and depositing an interconnection so as to be in physical contact with the top of the second portion of the upper electrode.

3. The process of claim 1, wherein the step of forming the insulating film includes a step of depositing the insulating film by a plasma-enhanced chemical vapor deposition (p-CVD) technique.

4. The process of claim 1, wherein the lift-off technique performed for forming the first portion of the upper electrode removes the first mask, and wherein the process further includes a step of patterning the second mask by photolithography after the step of forming the first portion of the upper electrode.

5. A process of forming a metal-insulator-metal (MIM) capacitor, comprising steps of:

forming an insulating film as a dielectric film of the MIM capacitor;

forming a first portion of an upper electrode on the insulating film by metal evaporation by using a first mask and a lift-off technique subsequent to the metal evaporation; and forming a second portion of the upper electrode on the first portion by metal evaporation by using a second mask and a lift-off technique subsequent to the metal evaporation for the second portion, wherein the step of forming the first portion of the upper electrode includes a step of sequentially evaporating a first metal and a second metal by using the first mask, and wherein the step of forming the second portion of the upper electrode includes a step of evaporating a third metal on the second metal by using the second mask, the second metal having a melting temperature higher than a melting temperature of the first metal and a melting temperature of the third metal.

6. The process of claim 5, wherein the second metal is one of titanium (Ti), platinum (Pt), tantalum (Ta), and molybdenum (Mo).

7. The process of claim 5, further comprising steps of, after the step of forming the second portion:

covering the second portion of the upper electrode with another insulating film, exposing a top of the second portion of the upper electrode by forming an opening in the another insulating film, and depositing an interconnection so as to be in physical contact with the top of the second portion of the upper electrode.

8. The process of claim 5, wherein the step of forming the insulating film includes a step of depositing the insulating film by a plasma-enhanced chemical vapor deposition (p-CVD) technique.

9. The process of claim 5, wherein the lift-off technique performed for forming the first portion of the upper electrode removes the first mask; and wherein the process further includes a step of patterning the second mask by photolithography after the step of forming the first portion of the upper electrode.

\* \* \* \* \*